US008889480B2

(12) United States Patent
Takechi et al.

(10) Patent No.: US 8,889,480 B2
(45) Date of Patent: Nov. 18, 2014

(54) METHOD OF FABRICATING A THIN-FILM DEVICE

(71) Applicants: Kazushige Takechi, Tokyo (JP); Mitsuru Nakata, Kanagawa (JP)

(72) Inventors: Kazushige Takechi, Tokyo (JP); Mitsuru Nakata, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 0 days.

(21) Appl. No.: 13/837,879

(22) Filed: Mar. 15, 2013

(65) Prior Publication Data

US 2013/0237012 A1    Sep. 12, 2013

Related U.S. Application Data

(62) Division of application No. 12/983,673, filed on Jan. 3, 2011, now Pat. No. 8,420,442, which is a division of application No. 11/890,426, filed on Aug. 6, 2007, now Pat. No. 7,884,360.

(30) Foreign Application Priority Data

Aug. 9, 2006  (JP) ................. 2006-217272

(51) Int. Cl.
*H01L 21/00* (2006.01)
*H01L 29/786* (2006.01)
*H01L 29/49* (2006.01)
*H01L 29/66* (2006.01)

(52) U.S. Cl.
CPC .... *H01L 29/66969* (2013.01); *H01L 29/78696* (2013.01); *H01L 29/7869* (2013.01); *H01L 29/4908* (2013.01); *H01L 29/78618* (2013.01)
USPC .......................................... 438/104; 438/151

(58) Field of Classification Search
CPC ............ H01L 29/7869; H01L 27/1225; H01L 29/66742; H01L 29/66969; H01L 29/4908; H01L 29/78618; H01L 29/78696
USPC .................................................. 438/104, 151
See application file for complete search history.

(56) References Cited

U.S. PATENT DOCUMENTS 6,969,886 B1 * 11/2005 Park et al. ..................... 257/324
7,071,127 B2 * 7/2006 Dong et al. ................... 438/787
(Continued)

FOREIGN PATENT DOCUMENTS

JP         04-214685       8/1992
JP         2003-60170      2/2003
(Continued)

OTHER PUBLICATIONS

English translation of Japanese Official Action dated Apr. 9, 2013 from related application JP2009-188007.
(Continued)

*Primary Examiner* — Laura Menz
(74) *Attorney, Agent, or Firm* — Scully, Scott, Murphy & Presser, P.C.

(57) ABSTRACT

A method of forming a thin-film device includes forming an oxide-semiconductor film formed on the first electrical insulator, and forming a second electrical insulator formed on the oxide-semiconductor film, the oxide-semiconductor film defining an active layer. The oxide-semiconductor film is comprised of a first interface layer located at an interface with the first electrical insulating insulator, a second interface layer located at an interface with the second electrical insulator, and a bulk layer other than the first and second interface layers. The method further includes oxidizing the oxide-semiconductor film to render a density of oxygen holes in at least one of the first and second interlayer layers is smaller than a density of oxygen holes in the bulk layer.

2 Claims, 15 Drawing Sheets

(56) References Cited

U.S. PATENT DOCUMENTS

| | | | |
|---|---|---|---|
| 7,189,992 B2* | 3/2007 | Wager et al. | 257/43 |
| 7,298,084 B2* | 11/2007 | Baude et al. | 313/506 |
| 7,323,729 B2* | 1/2008 | Dong et al. | 257/288 |
| 7,339,187 B2* | 3/2008 | Wager et al. | 257/43 |
| 7,453,065 B2* | 11/2008 | Saito et al. | 250/338.4 |
| 7,468,304 B2* | 12/2008 | Kaji et al. | 438/308 |
| 7,494,940 B2* | 2/2009 | Doh et al. | 438/785 |
| 7,535,010 B2* | 5/2009 | Saito et al. | 250/370.09 |
| 7,547,591 B2* | 6/2009 | Hoffman et al. | 438/151 |
| 7,601,984 B2* | 10/2009 | Sano et al. | 257/57 |
| 7,663,116 B2* | 2/2010 | Saito et al. | 250/370.09 |
| 7,691,715 B2* | 4/2010 | Kaji et al. | 438/308 |
| 7,884,360 B2* | 2/2011 | Takechi et al. | 257/57 |
| 7,923,722 B2* | 4/2011 | Ryu et al. | 257/43 |
| 7,977,675 B2* | 7/2011 | Kawamura et al. | 257/43 |
| 7,982,216 B2* | 7/2011 | Imai | 257/43 |
| 8,178,926 B2* | 5/2012 | Nakayama | 257/359 |
| 8,188,480 B2* | 5/2012 | Itai | 257/72 |
| 8,203,143 B2* | 6/2012 | Imai | 257/43 |
| 8,420,442 B2* | 4/2013 | Takechi et al. | 438/104 |
| 2004/0235295 A1* | 11/2004 | Dong et al. | 438/680 |
| 2006/0211270 A1* | 9/2006 | Dong et al. | 438/787 |
| 2007/0141784 A1* | 6/2007 | Wager et al. | 438/261 |
| 2008/0038882 A1* | 2/2008 | Takechi et al. | 438/151 |
| 2008/0108198 A1* | 5/2008 | Wager et al. | 438/308 |
| 2008/0237598 A1* | 10/2008 | Nakayama | 257/59 |
| 2008/0277657 A1* | 11/2008 | Jeong et al. | 257/43 |
| 2008/0296568 A1* | 12/2008 | Ryu et al. | 257/43 |
| 2009/0001881 A1* | 1/2009 | Nakayama | 313/504 |
| 2009/0127550 A1* | 5/2009 | Imai | 257/43 |
| 2010/0038641 A1* | 2/2010 | Imai | 257/57 |
| 2010/0163863 A1* | 7/2010 | Yaegashi | 257/43 |
| 2011/0097844 A1* | 4/2011 | Takechi et al. | 438/104 |

FOREIGN PATENT DOCUMENTS

| | | |
|---|---|---|
| JP | 2003-86808 | 3/2003 |
| JP | 2003-179233 | 6/2003 |
| JP | 2004-235180 | 8/2004 |
| JP | 2004-319673 | 11/2004 |
| JP | 2004-349583 | 12/2004 |
| JP | 2005-33172 | 2/2005 |
| JP | 2005-077822 | 3/2005 |
| JP | 2006-502597 | 1/2006 |
| JP | 2006-165527 | 6/2006 |
| JP | 2006-165529 | 6/2006 |
| JP | 2006-165531 | 6/2006 |

OTHER PUBLICATIONS

Japanese Official Action dated Nov. 5, 2008.

United States Official Action dated Apr. 13, 2010 from U.S. Appl. No. 11/890,426.

United States Official Action dated Jul. 30, 2012 from U.S. Appl. No. 12/983,673.

United States Official Action dated Sep. 14, 2012 from U.S. Appl. No. 12/983,673.

* cited by examiner

METHOD OF FABRICATING A THIN-FILM DEVICE

CROSS REFERENCE TO RELATED APPLICATION

The present application is a divisional application of U.S. patent application Ser. No. 12/983,673 filed Jan. 3, 2011 which is a divisional of U.S. patent application Ser. No. 11/890,426 filed on Aug. 6, 2007 which claims priority to Japanese Patent Application 2006-217272 filed Aug. 9, 2006, the entire contents of which are incorporated herein by reference.

BACKGROUND OF THE INVENTION

1. Field of the Invention

The invention relates to a thin-film device, and a method of fabricating the same.

2. Description of the Related Art

A transparent electrically conductive film composed of oxide, such as an ITO film composed of compound of indium (In), tin (Sn), and oxygen (O), is frequently used in a flat panel display or a photoelectric transfer device, since it has a sheet resistance of a few ohms per a unit area even if it has a small thickness such as hundreds of nanometers, and it has high transmittance to visible light.

Furthermore, a study to a thin-film transistor including a channel layer composed of transparent oxide semiconductor such as In—Ga—Zn—O has been recently started. Such oxide semiconductor contains highly ionic bonds, and is characterized by a small difference in electron mobility between crystalline state and amorphous state. Accordingly, relatively high electron mobility can be obtained even in amorphous state.

Since an amorphous film of oxide semiconductor can be formed at room temperature by carrying out sputtering, a study about a thin-film transistor composed of oxide semiconductor to be formed on a resin substrate such as a PET substrate has been started.

For instance, a thin-film transistor composed of oxide semiconductor is suggested in Japanese Patent Application Publication No. 2005-033172 (paragraph 0041), Japanese Patent Application Publication No. 2003-179233 (paragraphs 0014-0016), Japanese Patent Application Publication No. 2003-86808 (paragraph 0053), Japanese Patent Application Publication No. 2003-60170 (paragraph 0037), and Japanese Patent Application Publication No. 2006-502597 (paragraphs 0021-0023).

In a thin-film transistor composed of oxide semiconductor, donor defects caused by oxygen holes existing in a semiconductor film, in particular, oxygen holes existing at an interface layer between a semiconductor film and an electrically insulating film exert much influence on electric characteristics of the thin-film transistor.

The above listed Publications are accompanied with a problem of insufficient control to oxygen holes existing at an interface layer.

In particular, Japanese Patent Application Publication No. 2006-502597 alleges that it is possible to reduce oxygen holes by annealing oxide semiconductor at 300 degrees centigrade or higher in oxidation atmosphere. Though such annealing may be effective to reduction in oxygen holes existing at an upper surface of an oxide-semiconductor film, such annealing is not effect to reduction in oxygen holes existing at a lower surface of an oxide-semiconductor film (that is, a region of oxide semiconductor close to an interface between an underlying insulating film and oxide semiconductor formed on the underlying insulating film). This is because such annealing is difficult to penetrate an oxide-semiconductor film.

It may be possible to oxidize even a lower surface of an oxide-semiconductor film by carrying out annealing at 600 degrees centigrade or higher for enhancing penetration of oxidation, however, in which case, there would be caused problems that it is not possible to use a cheap glass substrate as an electrically insulating substrate, and that if a metal film exists below an oxide-semiconductor film, annealing causes metal of which the metal film is composed to diffuse into the oxide-semiconductor film, and resultingly, the oxide-semiconductor film is contaminated.

Thus, it was not possible to fabricate a thin-film transistor composed of oxide semiconductor and having desired characteristics sufficiently applicable to a display driver, on a cheap glass substrate with high reproducibility and high fabrication yield.

SUMMARY OF THE INVENTION

In view of the above-mentioned problems in the related art, it is an exemplary object of the present invention to provide a thin-film device such as a thin-film transistor, which is capable of controlling generation of oxygen holes at an interface layer, and providing desired characteristics.

It is further an exemplary object of the present invention to provide a method of fabricating the above-mentioned thin-film device with high reproducibility and high fabrication yield.

In a first exemplary aspect of the present invention, there is provided a thin-film device including a first electrical insulator, an oxide-semiconductor film formed on the first electrical insulator, and a second electrical insulator formed on the oxide-semiconductor film, the oxide-semiconductor film defining an active layer, the oxide-semiconductor film being comprised of a first interface layer located at an interface with the first electrical insulating insulator, a second interface layer located at an interface with the second electrical insulator, and a bulk layer other than the first and second interface layers, a density of oxygen holes in at least one of the first and second interlayer layers being smaller than a density of oxygen holes in the bulk layer.

In a second exemplary aspect of the present invention, there is provided a method of fabricating a thin-film device, including forming an oxide-semiconductor film on a first electrical insulator, forming a second electrical insulator on the oxide-semiconductor film, the oxide-semiconductor film defining an active layer, the oxide-semiconductor film being comprised of a first interface layer located at an interface with the first electrical insulating insulator, a second interface layer located at an interface with the second electrical insulator, and a bulk layer other than the first and second interface layers, and oxidizing the oxide-semiconductor film to render a density of oxygen holes in at least one of the first and second interlayer layers smaller than a density of oxygen holes in the bulk layer.

There is further provided a method of fabricating a thin-film device, including forming an oxide-semiconductor film on a first electrical insulator, and forming a second electrical insulator on the oxide-semiconductor film, the oxide-semiconductor film defining an active layer, the oxide-semiconductor film being formed by repeatedly carrying out formation of an oxide-semiconductor film and oxidation to the oxide-semiconductor film, the oxide-semiconductor film being comprised of a first interface layer located at an interface with the first electrical insulating insulator, a second interface layer located at an interface with the second electrical insulator, and a bulk layer other than the first and second interface layers, a density of oxygen holes in at least one of the first and second interlayer layers being smaller than a density of oxygen holes in the bulk layer.

There is still further provided a method of fabricating a thin-film device, including forming an oxide-semiconductor film on a first electrical insulator, forming a second electrical insulator on the oxide-semiconductor film, the oxide-semiconductor film defining an active layer, the oxide-semiconductor film being formed by repeatedly carrying out formation of an oxide-semiconductor film and oxidation to the oxide-semiconductor film, and oxidizing the oxide-semiconductor film to render a density of oxygen holes in at least one of the first and second interlayer layers smaller than a density of oxygen holes in the bulk layer.

The above and other objects and advantageous features of the present invention will be made apparent from the following description made with reference to the accompanying drawings, in which like reference characters designate the same or similar parts throughout the drawings.

DESCRIPTION OF THE EXEMPLARY EMBODIMENTS

Exemplary embodiments in accordance with the present invention will be explained hereinbelow with reference to drawings.

[First Exemplary Embodiment]

FIGS. 1 to 8 are cross-sectional views of a thin-film device 100, each showing a step to be carried out in a method of fabricating a thin-film device 100 in accordance with the first exemplary embodiment.

A thin-film device 100 in the first exemplary embodiment is comprised of a bottom gate stagger type thin-film transistor.

Hereinbelow is explained a method of fabricating the thin-film device 100.

Figure 1:
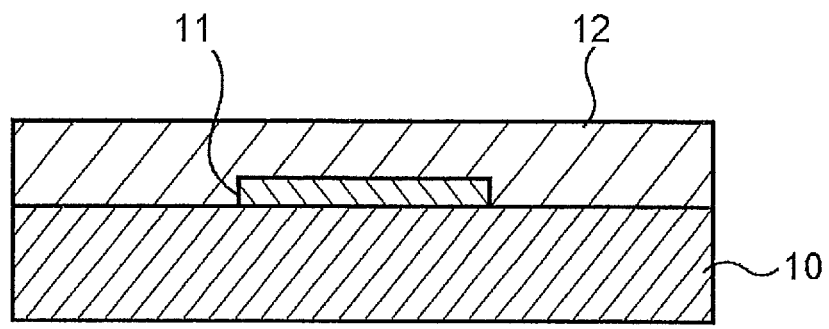
FIG. 1 is a cross-sectional view, each showing a step to be carried out in a method of fabricating a thin-film device in accordance with the first exemplary embodiment.

First, as illustrated in FIG. 1, a gate metal film is formed on an electrically insulating substrate 10, and then, the gate metal film is patterned into a gate electrode 11.

Then, a gate insulating film 12 as a first electrical insulator is formed on the electrically insulating substrate 10 so as to cover the gate electrode 11 therewith.

Figure 2:
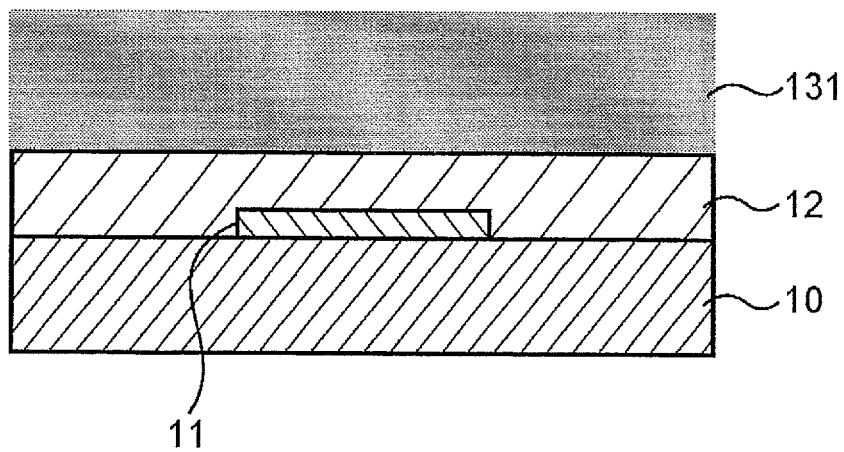
FIG. 2 is a cross-sectional view, each showing a step to be carried out in a method of fabricating a thin-film device in accordance with the first exemplary embodiment.

Then, as illustrated in FIG. 2, first oxidation 131 is applied to the gate insulating film 12 without exposing a device (that is, the electrically insulating substrate 10, the gate electrode 11, and the gate insulating film 12) to atmosphere.

The first oxidation 131 is comprised of application of oxygen plasma, for instance.

The first oxidation 131 causes oxygen to be adhered to a surface of the gate insulating film 12. This ensures that if oxygen deficiency were generated at a surface of the gate insulating film, 12, it would be possible to remove the oxygen deficiency.

Figure 3:
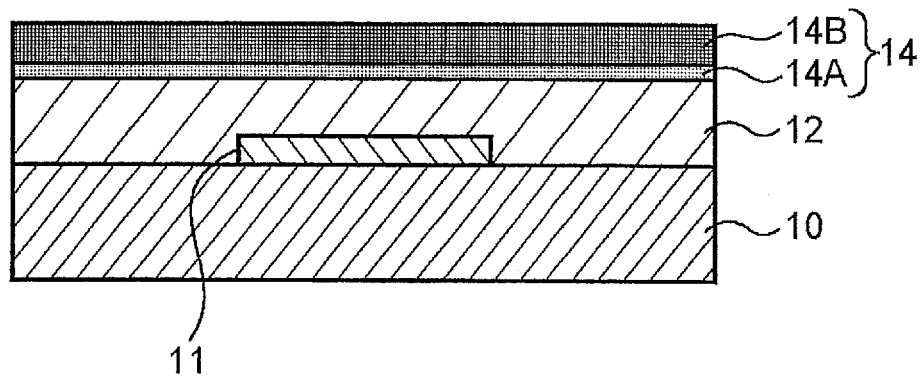
FIG. 3 is a cross-sectional view, each showing a step to be carried out in a method of fabricating a thin-film device in accordance with the first exemplary embodiment.

Following the first oxidation 131, as illustrated in FIG. 3, an oxide-semiconductor film 14 is formed on the gate insulating film 12 without exposing to atmosphere.

As a result, a first interface layer 14A which is a portion of the oxide-semiconductor film 14 located at an interface with the gate insulating film 12 is oxidized by oxygen having been adhered to a surface of the gate insulating film 12.

Thus, oxygen hole defect can be reduced in the first interface layer 14A as a part of the oxide-semiconductor film 14.

Specifically, a density of oxygen holes in the first interface layer 14A of the oxide-semiconductor film 14 becomes smaller than a density of oxygen holes in a bulk layer 14B of the oxide-semiconductor film 14.

Figure 4:
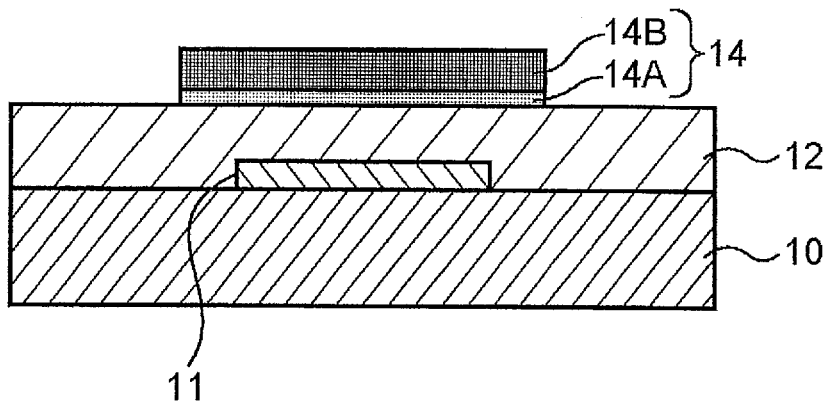
FIG. 4 is a cross-sectional view, each showing a step to be carried out in a method of fabricating a thin-film device in accordance with the first exemplary embodiment.

Then, as illustrated in FIG. 4, the oxide-semiconductor film 14 is patterned.

Figure 5:
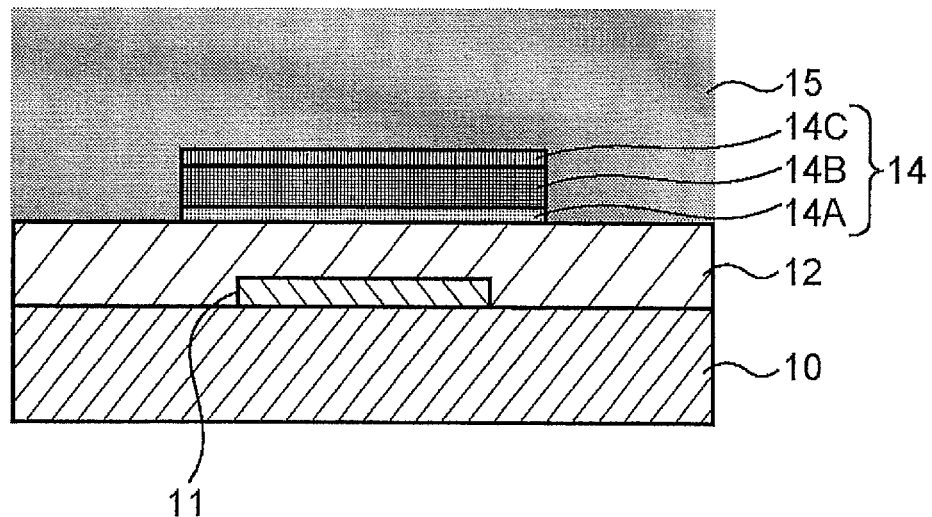
FIG. 5 is a cross-sectional view, each showing a step to be carried out in a method of fabricating a thin-film device in accordance with the first exemplary embodiment.

Then, as illustrated in FIG. 5, reduction 15 is applied to the oxide-semiconductor film 14. For instance, the reduction 15 is comprised of application of reducing plasma.

As a result, oxygen hole defect is generated at a surface 14C of the oxide-semiconductor film 14.

Specifically, a density of oxygen holes in the surface 14C of the oxide-semiconductor film 14 becomes higher than a density of oxygen holes in the bulk layer 14B of the oxide-semiconductor film 14.

Figure 6:
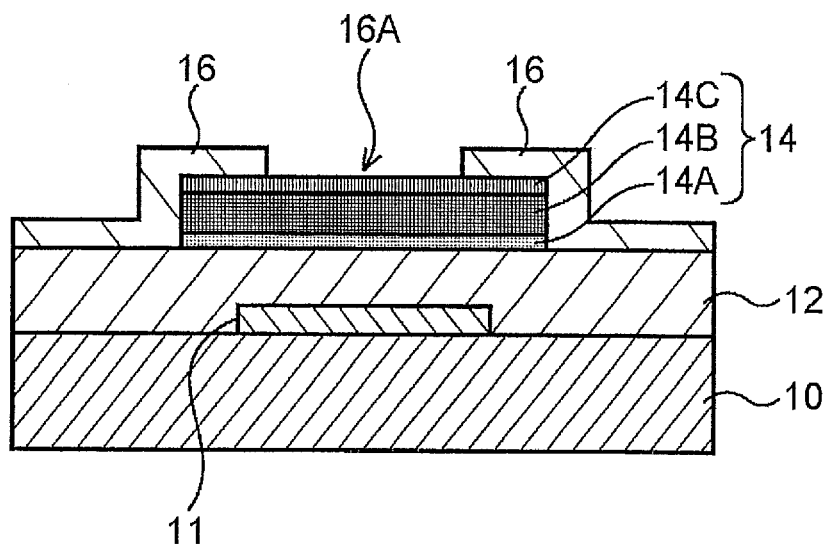
FIG. 6 is a cross-sectional view, each showing a step to be carried out in a method of fabricating a thin-film device in accordance with the first exemplary embodiment.

As illustrated in FIG. 6, a source/drain metal film is formed so as to entirely cover the gate insulating film 12 and the oxide-semiconductor film 14 therewith, and then, the source/drain metal film is patterned into source/drain electrodes 16 one of which is a source electrode and the other is a drain electrode.

It is preferable that the reduction 15 (see FIG. 5) and the subsequent formation of the source/drain metal film are carried out successively without exposing to atmosphere.

Figure 7:
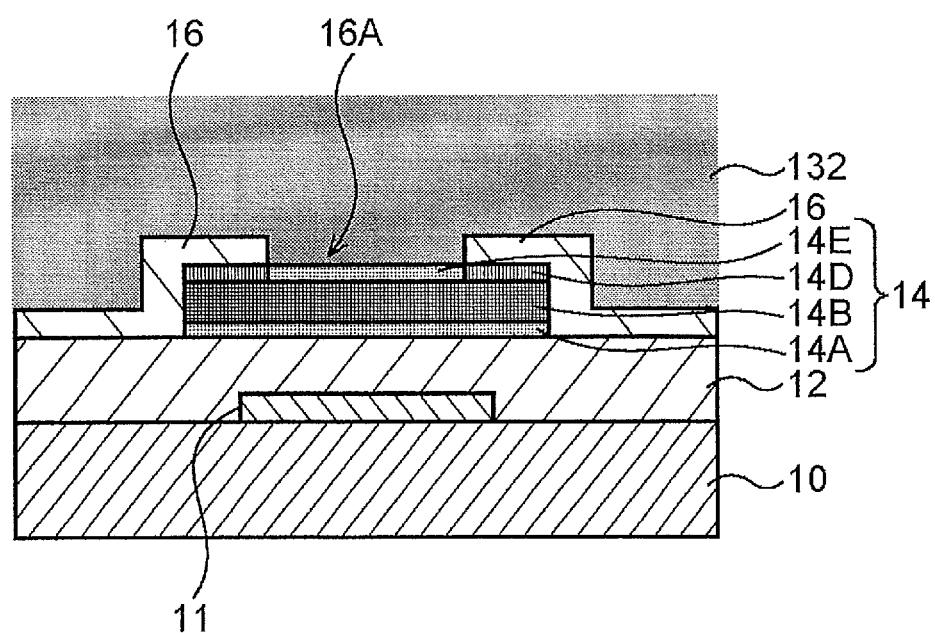
FIG. 7 is a cross-sectional view, each showing a step to be carried out in a method of fabricating a thin-film device in accordance with the first exemplary embodiment.

Then, as illustrated in FIG. 7, second oxidation 132 is applied to the oxide-semiconductor film 14 through an opening 16A formed between the source and drain electrodes 16. For instance, the second oxidation 132 is comprised of application of oxygen plasma.

As a result, a second interface layer 14E, that is, a portion of the surface 14C (see FIG. 6) of the oxide-semiconductor film 14, exposed outside through the opening 16A, is oxidized with the result of reduction in oxygen hole defects existing at the second interface layer 14E.

Thus, a density of oxygen holes in the second interface layer 14E of the oxide-semiconductor film 14 becomes smaller than a density of oxygen holes in the bulk layer 14B of the oxide-semiconductor film 14.

A portion of the surface 14C (see FIG. 6) of the oxide-semiconductor film 14 other than the second interface layer 14E, that is, a portion of the oxide-semiconductor film 14 existing at an interface with the source and drain electrodes 16 defines a third interface layer 14D.

Figure 8:
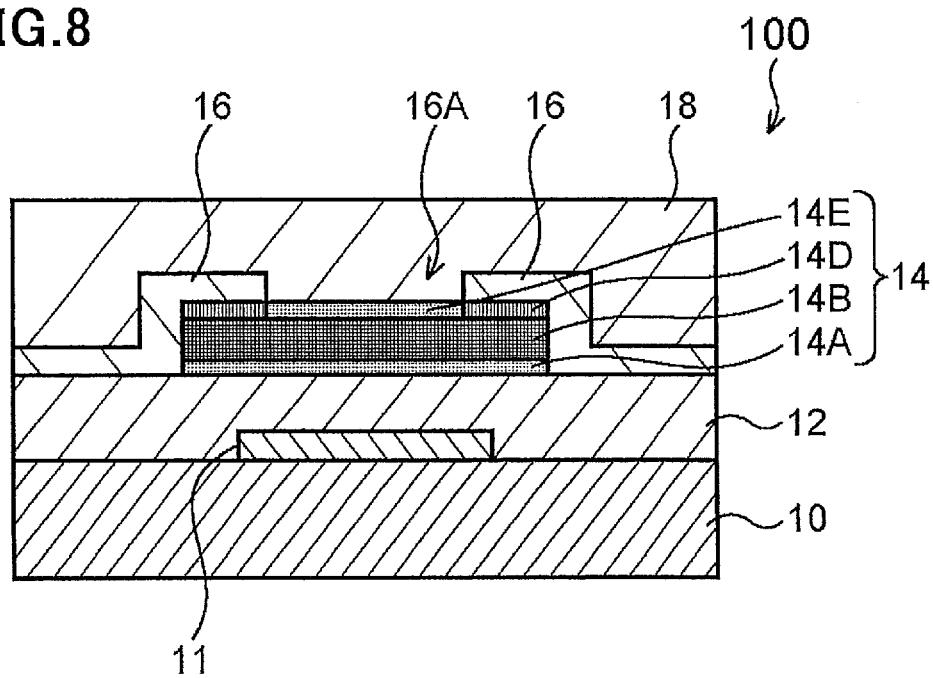
FIG. 8 is a cross-sectional view, each showing a step to be carried out in a method of fabricating a thin-film device in accordance with the first exemplary embodiment.

Then, as illustrated in FIG. 8, there is formed a protection insulating film 18 as a second electrical insulator so as to cover the source and drain electrodes 16 therewith and further cover the oxide-semiconductor film 14 therewith at the opening 16A formed between the source electrode 16 and the drain electrode 16.

Thus, there is fabricated the thin-film device 100.

It is preferable that the second oxidation 132 (see FIG. 7) and the subsequent formation of the protection insulating film 18 are carried out successively without exposing to atmosphere.

The first interface layer 14A which is a portion of the oxide-semiconductor film 14 located at an interface with the gate insulating film 12 has a density of oxygen holes in the range of $1 \times 10^{12}$ cm$^{-3}$ to $1 \times 10^{18}$ cm$^{-3}$ both inclusive, for instance.

The bulk layer 14B which is a portion of the oxide-semiconductor film 14 has a density of oxygen holes in the range of $1 \times 10^{16}$ cm$^{-3}$ to $1 \times 10^{20}$ cm$^{-3}$ both inclusive, for instance.

A density of oxygen holes of each of the first interface layer 14A and the bulk layer 14B can be controlled by controlling conditions under which they are formed. Specifically, if a density of oxygen in atmosphere is increased during they are being formed, it would be possible to reduce a density of oxygen holes of them, and if a density of oxygen in atmosphere is reduced during they are being formed, it would be possible to increase a density of oxygen holes of them.

The oxidation 131 illustrated in FIG. 2 makes it possible to optimally reduce an electron density in the first interface layer 14A, ensuring that the thin-film device 100 can has superior switching characteristic, specifically, five or more columns ($1 \times 10^4$ or greater) in an ON/OFF ratio of a drain current.

The third interface layer 14D which is a portion of the oxide-semiconductor film 14 located at an interface with the source and drain electrodes 16 has a density of oxygen holes in the range of $1 \times 10^{19}$ cm$^{-3}$ to $1 \times 10^{22}$ cm$^{-3}$ both inclusive, for instance.

The second interface layer 14E which is a portion of the oxide-semiconductor film 14 located at an interface with the protection insulating film 18 has a density of oxygen holes in the range of $1 \times 10^{16}$ cm$^{-3}$ to $1 \times 10^{20}$ cm$^{-3}$ both inclusive, for instance.

A density of oxygen holes of each of the third interface layer 14D and the second interface layer 14E can be controlled by controlling conditions under which they are formed. Specifically, if a density of oxygen in atmosphere is increased during they are being formed, it would be possible to reduce a density of oxygen holes of them, and if a density of oxygen in atmosphere is reduced during they are being formed, it would be possible to increase a density of oxygen holes of them.

The reduction 15 illustrated in FIG. 5 makes it possible to optimally increase an electron density in the third interface layer 14D, ensuring that the third interface layer 14D can have functions as an ohmic contact layer.

The oxidation 132 illustrated in FIG. 7 makes it possible to optimally reduce an electron density in the second interface layer 14E, ensuring that an off current caused by a back-channel electron current can be effectively reduced.

In the thin-film device 100 including a multi-layered structure comprised of, in this order, the gate electrode 11, the gate insulating film (first electrical insulator) 12, the oxide-semiconductor film 14, the source and drain electrodes 16, and the protection insulating film (second electrical insulator) 18, it is possible to control the defect (that is, generation of excessive electron donors) caused by oxygen holes existing at an interface between the oxide-semiconductor film 14 and the insulating films 12, 18.

That is, it is possible to positively generate oxygen holes in a region in which oxygen holes are required, and prevent generation of oxygen holes in a region in which oxygen holes are not required.

Specifically, it is possible to reduce the defect caused by oxygen holes in the first interface layer 14A located at an interface with the gate insulating film 12, by carrying out the first oxidation 131 illustrated in FIG. 2, and then, forming the oxide-semiconductor film 14 as illustrated in FIG. 3. That is, a density of oxygen holes in the first interface layer 14A can be made smaller than a density of oxygen holes in the bulk layer 14B.

The reduction 15 illustrated in FIG. 5 positively facilitates to generate oxygen hole defect in the surface 14C of the oxide-semiconductor film 14 (specifically, the third interface layer 14D (see FIGS. 7 and 8) which is a portion of the surface 14C located at an interface with the source and drain electrodes 16), and causes the thus generated oxygen hole defect to act as electron donors to thereby make the third interface layer 14D located at an interface with the source and drain electrodes 16, become an N-type layer, ensuring increased possibility of formation of ohmic contact junction.

The second oxidation 132 illustrated in FIG. 7 makes it possible to reduce oxygen hole defect in the second interface layer 14E which is a portion of the surface 14C of the oxide-semiconductor film 14 exposed through the opening 16A, ensuring that an off current in the thin-film device 100 can be reduced.

[Second Exemplary Embodiment]

FIGS. 9 to 14 are cross-sectional views of a thin-film device 200, each showing a step to be carried out in a method of fabricating a thin-film device 200 in accordance with the second exemplary embodiment.

A thin-film device 200 in the second exemplary embodiment is comprised of a top gate stagger type thin-film transistor.

Hereinbelow is explained a method of fabricating the thin-film device 200.

Figure 9:
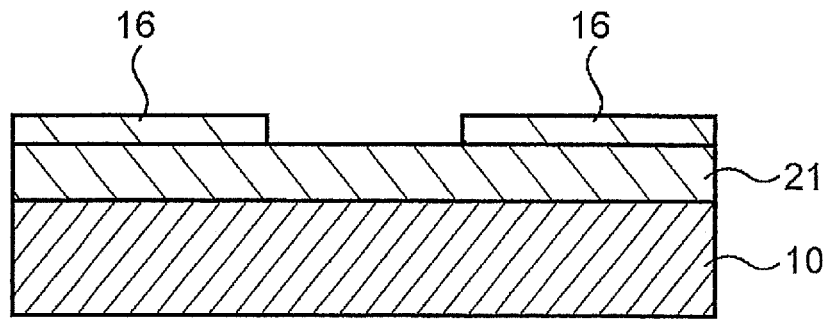
FIG. 9 is a cross-sectional view, each showing a step to be carried out in a method of fabricating a thin-film device in accordance with the second exemplary embodiment.

As illustrated in FIG. 9, an underlying insulating film (first electrical insulator) 21 is formed on an electrically insulating substrate 10. Then, a source/drain metal film is formed on the underlying insulating film 21, and subsequently, the source/drain metal film is patterned into source and drain electrodes 16 (one of which is a source electrode, and the other is a drain electrode).

Figure 10:
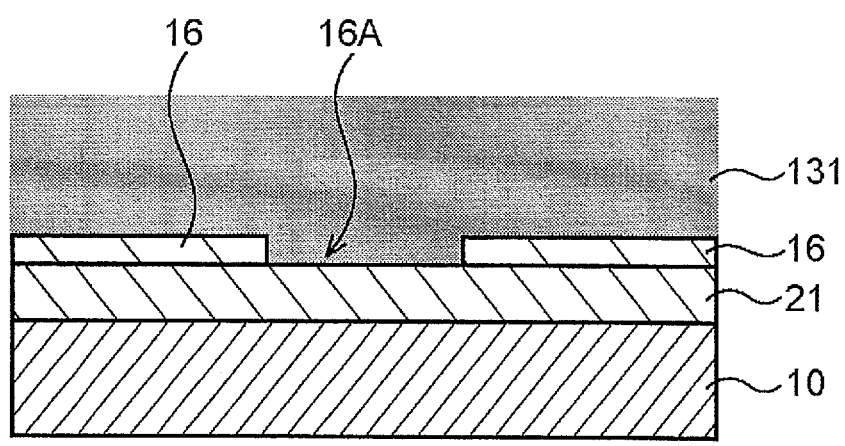
FIG. 10 is a cross-sectional view, each showing a step to be carried out in a method of fabricating a thin-film device in accordance with the second exemplary embodiment.

Then, as illustrated in FIG. 10, first oxidation 131 is applied to the underlying insulating film 21.

The first oxidation 131 is comprised of application of oxygen plasma, for instance.

The first oxidation 131 causes oxygen to be adhered to a surface of the underlying insulating film 21. This ensures that if oxygen deficiency were generated at a surface of the underlying insulating film 21, it would be possible to remove the oxygen deficiency.

Figure 11:
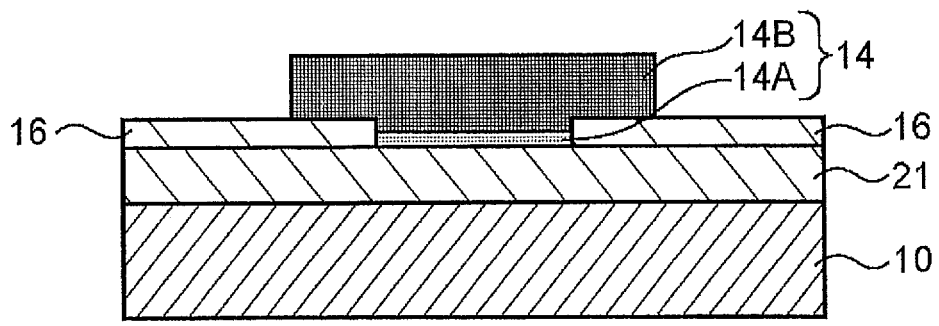
FIG. 11 is a cross-sectional view, each showing a step to be carried out in a method of fabricating a thin-film device in accordance with the second exemplary embodiment.

Following the first oxidation 131, an oxide-semiconductor film 14 is formed on the underlying insulating film 21 and the source/drain electrodes 16. Then, the oxide-semiconductor film 14 is patterned into a desired shape, as illustrated in FIG. 11.

As a result, a first interface layer 14A which is a portion of the oxide-semiconductor film 14 located at an interface with the underlying insulating film 21 is oxidized by oxygen having been adhered to a surface of the underlying insulating film 21.

Thus, oxygen hole defect can be reduced in the first interface layer 14A as a part of the oxide-semiconductor film 14.

Specifically, a density of oxygen holes in the first interface layer 14A of the oxide-semiconductor film 14 becomes smaller than a density of oxygen holes in a bulk layer 14B of the oxide-semiconductor film 14.

It is preferable that the first oxidation 131 illustrated in FIG. 10 and the formation of the oxide-semiconductor film 14 are successively carried out without exposing to atmosphere.

Figure 12:
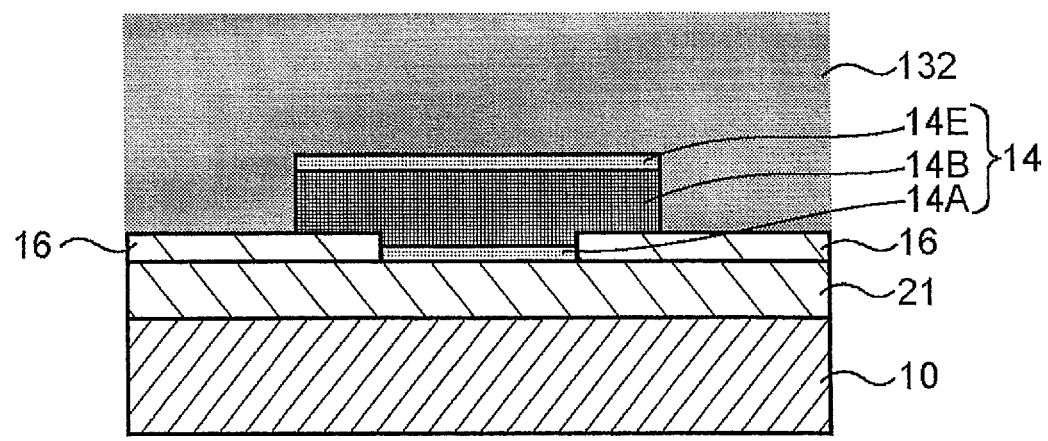
FIG. 12 is a cross-sectional view, each showing a step to be carried out in a method of fabricating a thin-film device in accordance with the second exemplary embodiment.

Then, as illustrated in FIG. 12, second oxidation 132 is applied to the oxide-semiconductor film 14. For instance, the second oxidation 132 is comprised of application of oxygen plasma.

As a result, a second interface layer 14E, that is, a surface 14C of the oxide-semiconductor film 14, is oxidized with the result of reduction in oxygen hole defects existing at the second interface layer 14E.

Thus, a density of oxygen holes in the second interface layer 14E of the oxide-semiconductor film 14 becomes smaller than a density of oxygen holes in the bulk layer 14B of the oxide-semiconductor film 14.

Figure 13:
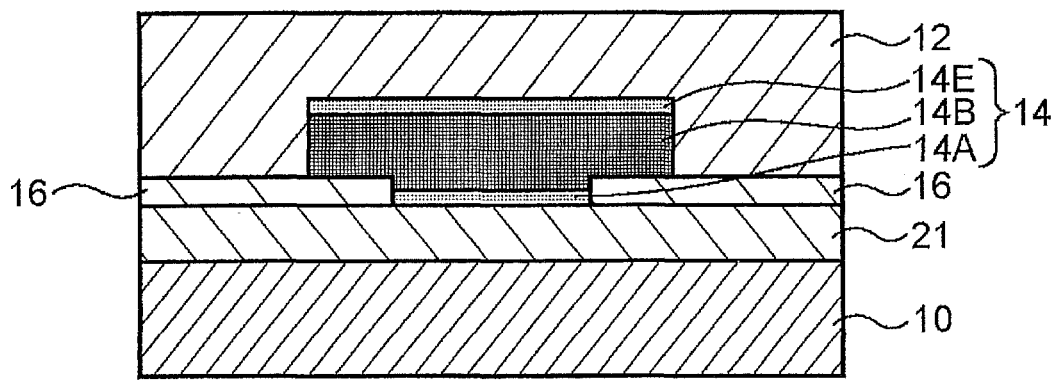
FIG. 13 is a cross-sectional view, each showing a step to be carried out in a method of fabricating a thin-film device in accordance with the second exemplary embodiment.

Then, as illustrated in FIG. 13, there is formed a gate insulating film 12 as a second electrical insulator so as to cover the oxide-semiconductor film 14 and the source and drain electrodes 16 therewith without exposing to atmosphere.

Figure 14:
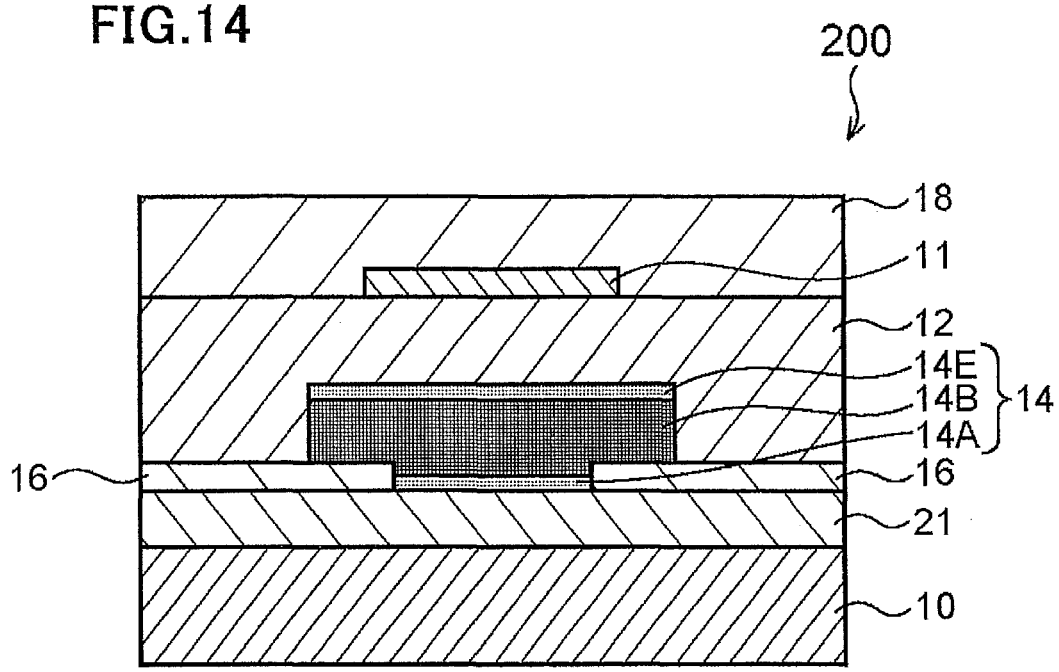
FIG. 14 is a cross-sectional view, each showing a step to be carried out in a method of fabricating a thin-film device in accordance with the second exemplary embodiment.

Then, as illustrated in FIG. 14, a gate electrode 11 is formed on the gate insulating film 12.

Then, a protection insulating film 18 is formed on the gate insulating film 12 so as to cover the gate electrode 11 therewith.

Thus, there is fabricated the thin-film device 200.

In the thin-film device 200 including a multi-layered structure comprised of, in this order, the underlying insulating film (first electrical insulator) 21, the source and drain electrodes 16, the oxide-semiconductor film 14, the gate insulating film (second electrical insulator) 12, the gate electrode 11, and the protection insulating film 18, it is possible to control the defect caused by oxygen holes existing at an interface between the oxide-semiconductor film 14 and the insulating films 21, 12.

Specifically, it is possible to reduce the defect caused by oxygen holes in the first interface layer 14A located at an interface with the underlying insulating film 21, by carrying out the first oxidation 131 illustrated in FIG. 10, and then, forming the oxide-semiconductor film 14 as illustrated in FIG. 11. That is, a density of oxygen holes in the first interface layer 14A can be made smaller than a density of oxygen holes in the bulk layer 14B.

The second oxidation 132 illustrated in FIG. 12 makes it possible to reduce oxygen hole defect in the second interface layer 14E located at an interface with the gate insulating film 12 to thereby optimally reduce an electron density in the second interface layer 14E, ensuring that an off current of the thin-film device 200 caused by a back-channel electron current can be effectively reduced.

[Third Exemplary Embodiment]

FIGS. 15 to 19 are cross-sectional views of a thin-film device 300, each showing a step to be carried out in a method of fabricating a thin-film device 300 in accordance with the third exemplary embodiment.

A thin-film device 300 in the third exemplary embodiment is comprised of a top gate planar type thin-film transistor.

Hereinbelow is explained a method of fabricating the thin-film device 300.

Figure 15:
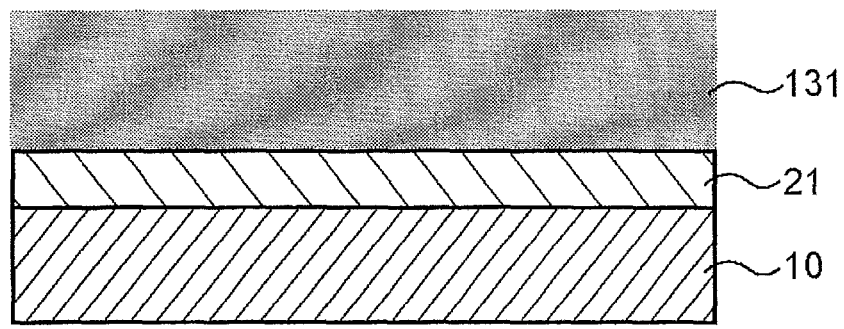
FIG. 15 is a cross-sectional view, each showing a step to be carried out in a method of fabricating a thin-film device in accordance with the third exemplary embodiment.

First, as illustrated in FIG. 15, an underlying insulating film 21 as a first electrical insulator is formed on an electrically insulating substrate 10.

Then, first oxidation 131 is applied to the underlying insulating film 21.

The first oxidation 131 is comprised of application of oxygen plasma, for instance.

Figure 16:
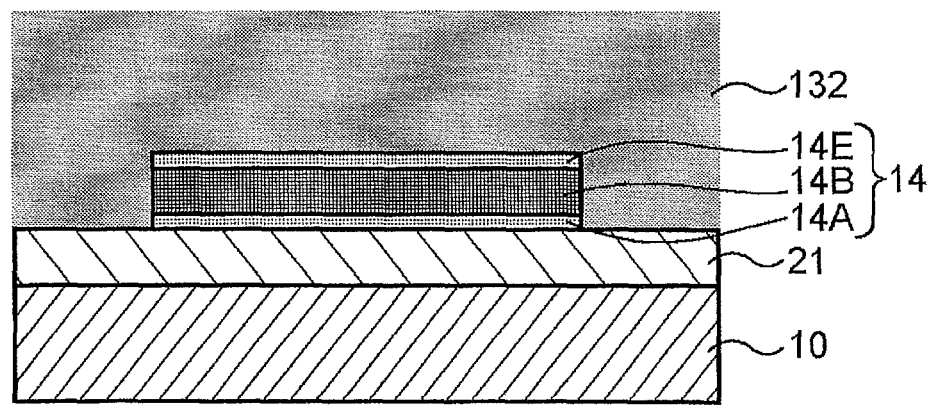
FIG. 16 is a cross-sectional view, each showing a step to be carried out in a method of fabricating a thin-film device in accordance with the third exemplary embodiment.

Then, as illustrated in FIG. 16, an oxide-semiconductor film 14 is formed on the underlying insulating film 21 without exposing to atmosphere.

The first oxidation 131 causes oxygen to be adhered to a surface of the underlying insulating film 21. A first interface layer 14A which is a portion of the oxide-semiconductor film 14 located at an interface with the underlying insulating film 21 is oxidized by oxygen having been adhered to a surface of the underlying insulating film 21.

Thus, oxygen hole defect can be reduced in the first interface layer 14A as a part of the oxide-semiconductor film 14.

Specifically, a density of oxygen holes in the first interface layer 14A becomes smaller than a density of oxygen holes in a bulk layer 14B of the oxide-semiconductor film 14.

Then, as illustrated in FIG. 16, the oxide-semiconductor film 14 is patterned.

Then, as illustrated in FIG. 16, second oxidation 132 is applied to the oxide-semiconductor film 14. For instance, the second oxidation 132 is comprised of application of oxygen plasma.

As a result, since a second interface layer 14E located at a surface of the oxide-semiconductor film 14, oxygen hole defect is reduced in the second interface layer 14E.

Specifically, a density of oxygen holes in the second interface layer 14E becomes smaller than a density of oxygen holes in the bulk layer 14B of the oxide-semiconductor film 14.

Figure 17:
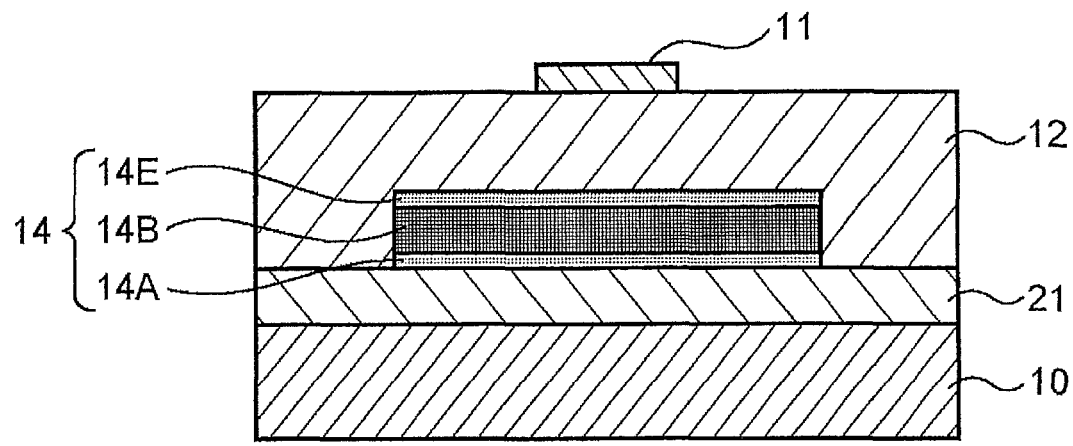
FIG. 17 is a cross-sectional view, each showing a step to be carried out in a method of fabricating a thin-film device in accordance with the third exemplary embodiment.

Then, as illustrated in FIG. 17, a gate insulating film 12 as a second electrical insulator is formed on the underlying insulating film 21 so as to cover the oxide-semiconductor film 14 therewith.

Then, a gate electrode 11 is formed on the gate insulating film 12.

Figure 18:
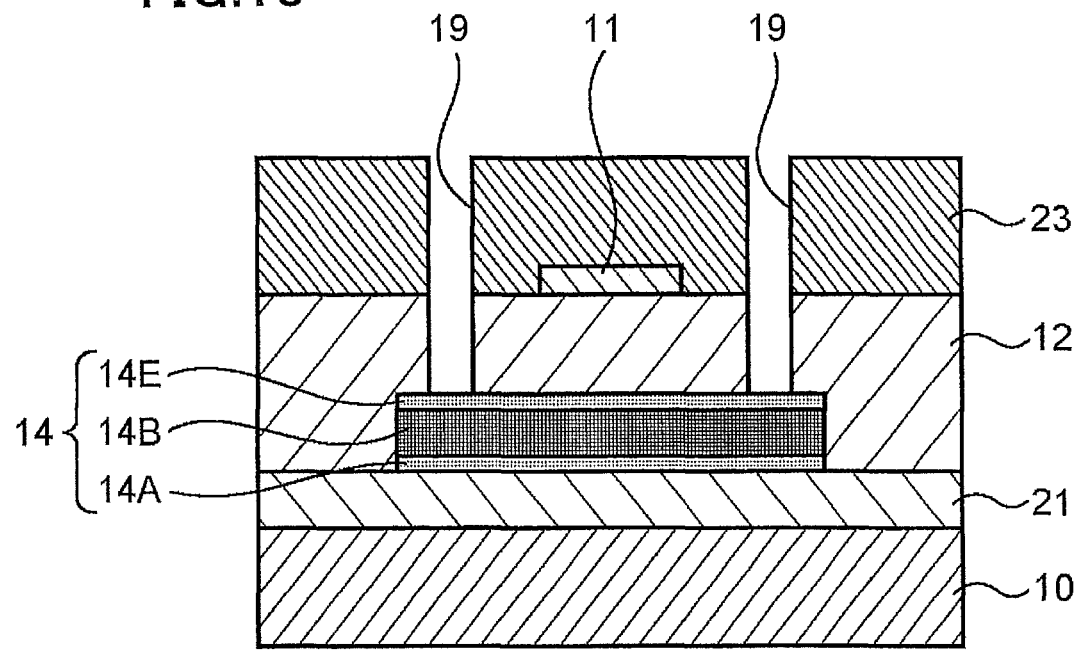
FIG. 18 is a cross-sectional view, each showing a step to be carried out in a method of fabricating a thin-film device in accordance with the third exemplary embodiment.

Then, as illustrated in FIG. 18, an interlayer insulating film 23 is formed on the gate insulating film 12 so as to cover the gate electrode 11 therewith.

Then, contact holes 19 are formed throughout the interlayer insulating film 23 and the gate insulating film 12 such that the contact holes 19 reach source/drain regions.

Figure 19:
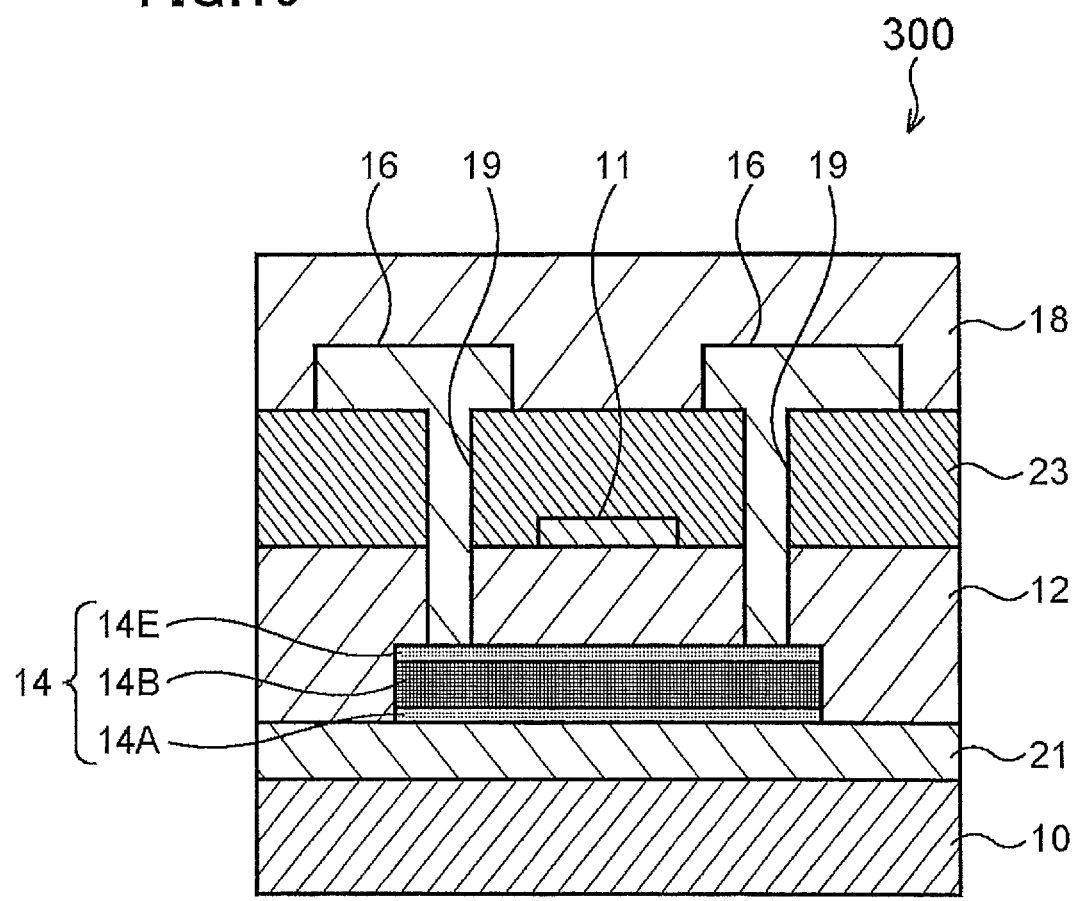
FIG. 19 is a cross-sectional view, each showing a step to be carried out in a method of fabricating a thin-film device in accordance with the third exemplary embodiment.

Then, as illustrated in FIG. 19, source and drain electrodes 16 are formed in the contact holes 19. Specifically, each of the source and drain electrodes 16 is comprised of a metal plug formed in the contact hole 19 so as to reach the second interface layer 14E of the oxide-semiconductor film 14, and a layer formed on the interlayer insulating film 23 and integrally with the metal plug.

Then, a protection insulating film 18 is formed on the interlayer insulating film 23 so as to cover the source and drain electrodes 16 therewith.

Thus, there is fabricated the thin-film device 300.

In the thin-film device 300 including a multi-layered structure comprised of, in this order, the underlying insulating film (first electrical insulator) 21, the oxide-semiconductor film 14, the gate insulating film (second electrical insulator) 12, the gate electrode 11, the interlayer insulating film 23, the source and drain electrodes 16, and the protection insulating film 18, it is possible to control the defect (that is, generation of excessive electron donors) caused by oxygen holes existing at an interface between the oxide-semiconductor film 14 and the insulating films 21, 12.

Specifically, it is possible to reduce the defect caused by oxygen holes in the first interface layer 14A located at an interface with the underlying insulating film 21, by carrying out the first oxidation 131 illustrated in FIG. 15, and then, forming the oxide-semiconductor film 14 as illustrated in FIG. 16. That is, a density of oxygen holes in the first interface layer 14A can be made smaller than a density of oxygen holes in the bulk layer 14B.

The second oxidation 132 illustrated in FIG. 16 makes it possible to reduce oxygen hole defect in the second interface layer 14E located at an interface with the gate insulating film 12 to thereby optimally reduce an electron density in the second interface layer 14E, ensuring that an off current of the thin-film device 300 caused by a back-channel electron current can be effectively reduced.

[Fourth Exemplary Embodiment]

FIGS. 20 to 24 are cross-sectional views of a thin-film device 400, each showing a step to be carried out in a method of fabricating a thin-film device 400 in accordance with the fourth exemplary embodiment.

A thin-film device 400 in the fourth exemplary embodiment is comprised of a bottom gate planar type thin-film transistor.

Hereinbelow is explained a method of fabricating the thin-film device 400.

Figure 20:
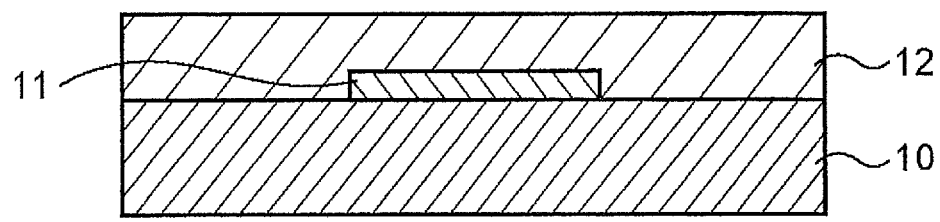
FIG. 20 is a cross-sectional view, each showing a step to be carried out in a method of fabricating a thin-film device in accordance with the fourth exemplary embodiment.

First, as illustrated in FIG. 20, a gate metal film is formed on an electrically insulating substrate 10, and then, the gate metal film is patterned into a gate electrode 11.

Then, a gate insulating film 12 as a first electrical insulator is formed on the electrically insulating substrate 10 so as to cover the gate electrode 11 therewith.

Figure 21:
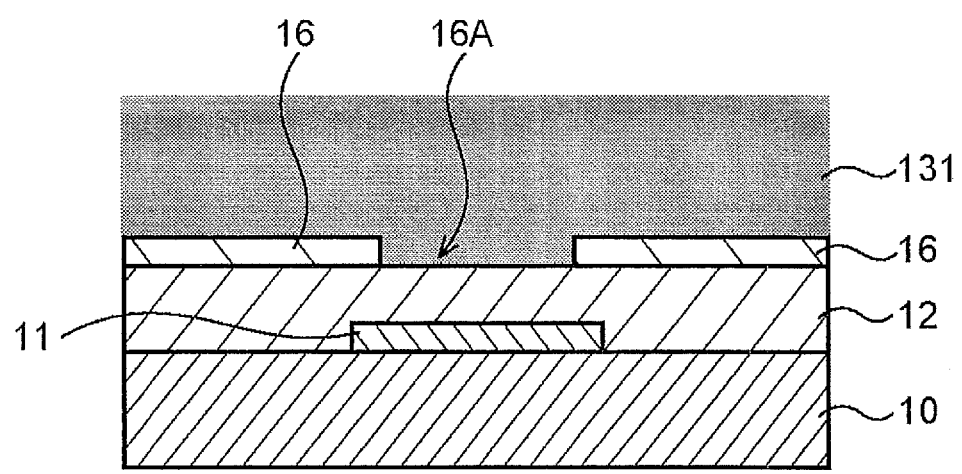
FIG. 21 is a cross-sectional view, each showing a step to be carried out in a method of fabricating a thin-film device in accordance with the fourth exemplary embodiment.

Then, as illustrated in FIG. 21, a source/drain metal film is formed so as to entirely cover the gate insulating film 12 therewith, and then, the source/drain metal film is patterned into source/drain electrodes 16, one of which is a source electrode and the other is a drain electrode. The source and drain electrodes 16 are spaced away from each other by an opening 16A.

Then, first oxidation 131 is applied to the gate insulating film 12.

The first oxidation 131 is comprised of application of oxygen plasma, for instance.

The first oxidation 131 causes oxygen to be adhered to a surface of the gate insulating film 12. This ensures that if oxygen deficiency were generated at a surface of the gate insulating film, 12, it would be possible to remove the oxygen deficiency.

Figure 22:
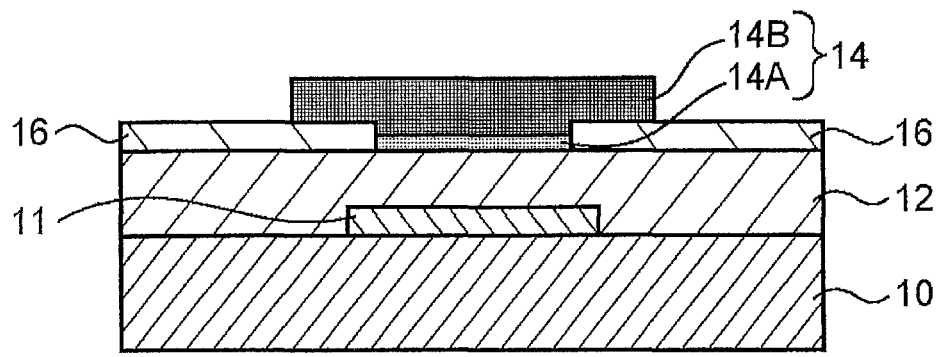
FIG. 22 is a cross-sectional view, each showing a step to be carried out in a method of fabricating a thin-film device in accordance with the fourth exemplary embodiment.

Following the first oxidation 131, as illustrated in FIG. 22, an oxide-semiconductor film 14 is formed on the gate insulating film 12 without exposing to atmosphere.

Then, the oxide-semiconductor film 14 is patterned into such a shape as illustrated in FIG. 22.

As a result, a first interface layer 14A which is a portion of the oxide-semiconductor film 14 located at an interface with the gate insulating film 12 is oxidized by oxygen having been adhered to a surface of the gate insulating film 12.

Thus, oxygen hole defect can be reduced in the first interface layer 14A as a part of the oxide-semiconductor film 14.

Specifically, a density of oxygen holes in the first interface layer 14A of the oxide-semiconductor film 14 becomes smaller than a density of oxygen holes in a bulk layer 14B of the oxide-semiconductor film 14.

Figure 23:
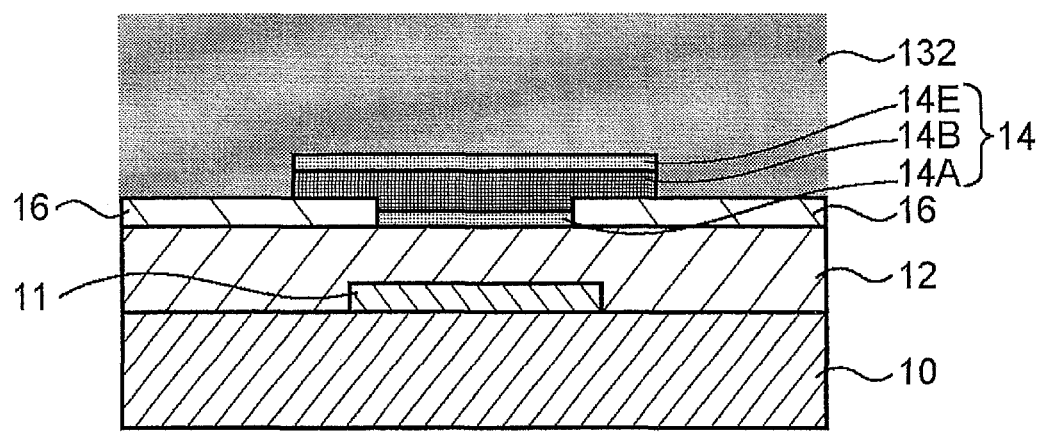
FIG. 23 is a cross-sectional view, each showing a step to be carried out in a method of fabricating a thin-film device in accordance with the fourth exemplary embodiment.

Then, as illustrated in FIG. 23, second oxidation 132 is applied to the oxide-semiconductor film 14. For instance, the second oxidation 132 is comprised of application of oxygen plasma.

Figure 24:
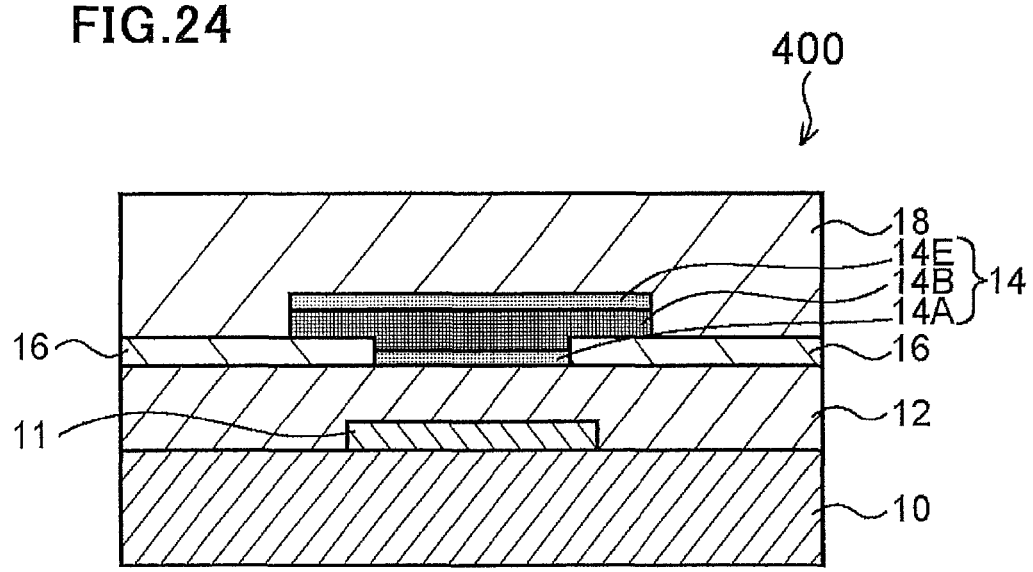
FIG. 24 is a cross-sectional view, each showing a step to be carried out in a method of fabricating a thin-film device in accordance with the fourth exemplary embodiment.

Then, as illustrated in FIG. 24, there is formed a protection insulating film 18 as a second electrical insulator on the source and drain electrodes 16 so as to cover the oxide-semiconductor film 14 therewith without exposing to atmosphere.

Thus, there is fabricated the thin-film device 400.

In the thin-film device 400 including a multi-layered structure comprised of, in this order, the gate electrode 11, the gate insulating film (first electrical insulator) 12, the source and drain electrodes 16, the oxide-semiconductor film 14, and the protection insulating film (second electrical insulator) 18, it is possible to control the defect (that is, generation of excessive electron donors) caused by oxygen holes existing at an interface between the oxide-semiconductor film 14 and the insulating films 12, 18.

Specifically, it is possible to reduce the defect caused by oxygen holes in the first interface layer 14A located at an interface with the gate insulating film 12, by carrying out the first oxidation 131 illustrated in FIG. 21, and then, forming the oxide-semiconductor film 14 as illustrated in FIG. 22. That is, a density of oxygen holes in the first interface layer 14A can be made smaller than a density of oxygen holes in the bulk layer 14B.

The second oxidation 132 illustrated in FIG. 23 makes it possible to reduce oxygen hole defect in the second interface layer 14E located at an interface with the protection insulating film 18 to thereby optimally reduce an electron density in the second interface layer 14E, ensuring that an off current of the thin-film device 400 caused by a back-channel electron current can be effectively reduced.

[Fifth Exemplary Embodiment]

In the above-mentioned first to fourth exemplary embodiments, the oxide-semiconductor film 14 in the thin-film devices 100, 200, 300 and 400 is formed at a time, that is, formed as a single film. In the fifth embodiment described below, the oxide-semiconductor film 14 is formed in a plurality of steps, that is, formed as having a multi-layered structure.

Hereinbelow is explained a method of fabricating the oxide-semiconductor film 14 in the fifth embodiment.

Figure 25:
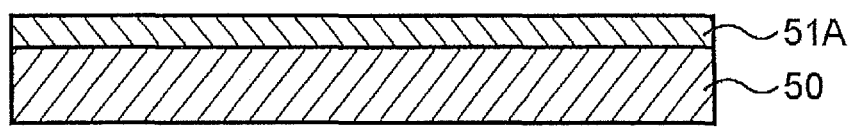
FIG. 25 is a cross-sectional view, each showing a step to be carried out in a method of fabricating an oxide-semiconductor film in accordance with the fourth exemplary embodiment.

First, as illustrated in FIG. 25, an extremely thin oxide-semiconductor film 51A is formed on a first electrical insulator 50.

The first electrical insulator 50 corresponds to the gate insulating film 12 explained in the first embodiment (see FIG. 8) and the fourth embodiment (see FIG. 24), or to the underlying film 21 explained in the second embodiment (see FIG. 14) and the third embodiment (see FIG. 19).

Figure 26:
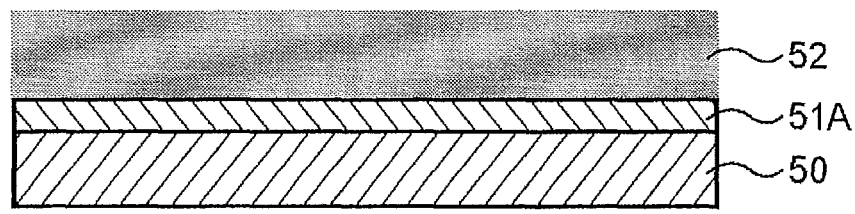
FIG. 26 is a cross-sectional view, each showing a step to be carried out in a method of fabricating an oxide-semiconductor film in accordance with the fourth exemplary embodiment.

Then, as illustrated in FIG. 26, oxidation 52 is applied to the oxide-semiconductor film 51A. For instance, the oxidation 52 is comprised of application of oxygen plasma.

As a result, the oxide-semiconductor film 51A is oxidized at a surface thereof.

Figure 27:
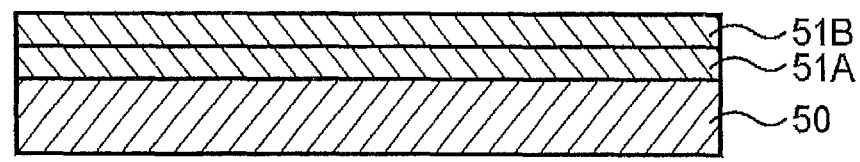
FIG. 27 is a cross-sectional view, each showing a step to be carried out in a method of fabricating an oxide-semiconductor film in accordance with the fourth exemplary embodiment.

Then, as illustrated in FIG. 27, an extremely thin oxide-semiconductor film 51B is formed on the oxide-semiconductor film 51A.

Figure 28:
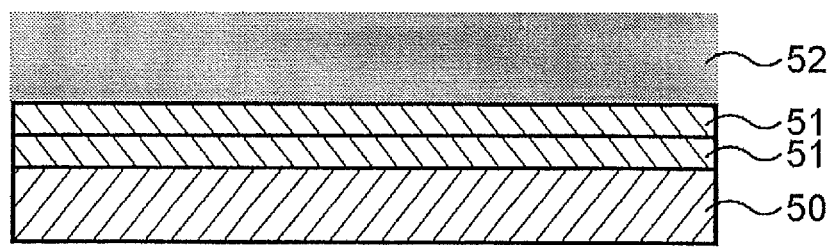
FIG. 28 is a cross-sectional view, each showing a step to be carried out in a method of fabricating an oxide-semiconductor film in accordance with the fourth exemplary embodiment.

Then, the oxidation 52 is applied to the oxide-semiconductor film 51B, as illustrated in FIG. 28.

Figure 29:
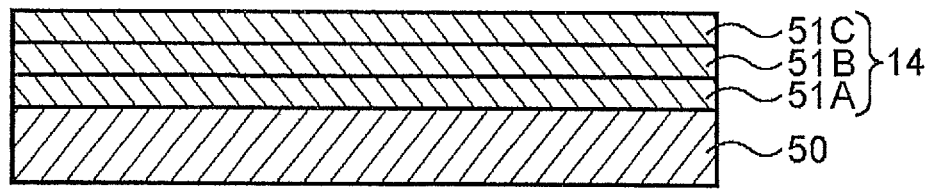
FIG. 29 is a cross-sectional view, each showing a step to be carried out in a method of fabricating an oxide-semiconductor film in accordance with the fourth exemplary embodiment.

Then, as illustrated in FIG. 29, an extremely thin oxide-semiconductor film 51C is formed on the oxide-semiconductor film 51B.

The step of applying oxidation to a first thin oxide-semiconductor film, illustrated in FIG. 26, and the step of forming a second thin oxide-semiconductor film on the first thin oxide-semiconductor film, illustrated in FIG. 27, are repeatedly carried out by a requisite number to thereby fabricate the oxide-semiconductor film 14.

In accordance with the fifth embodiment, since the oxide-semiconductor film 14 is formed by repeatedly alternately carrying out the formation of the oxide-semiconductor film and the application of the oxidation 52 to the oxide-semiconductor film, it would be possible to sufficiently oxidize each of the oxide-semiconductor films 51A, 51B and 51C, ensuring the formation of the oxide-semiconductor film 14 having desired film-characteristics.

In the above-mentioned first to fifth embodiments, the oxide-semiconductor film 14 may be composed of amorphous oxide or crystalline oxide containing at least one of Zn, Ga and In.

The oxide-semiconductor film 14 may be fabricated, for instance, by sputtering, evaporation or chemical vapor deposition (CVD). In particular, the oxide-semiconductor film 14 composed of crystalline oxide can be fabricated by irradiating laser such as XeCl excimer laser to an amorphous film. This is because the oxide-semiconductor film 14 is almost transparent to visible light, for instance, but is opaque to XeCl excimer laser having a wavelength of 308 nanometers, and hence, can absorb the XeCl excimer laser.

It is also possible to crystallize the oxide-semiconductor film 14 by irradiating laser or light having a wavelength shorter than a wavelength of visible lights to an amorphous film.

The oxide-semiconductor film 14 may be fabricated by dissolving powdered oxide-semiconductor into solvent, coating or printing the solvent containing the oxide-semiconductor, onto a substrate, and heating the solvent to thereby evaporate the solvent and allow only the oxide-semiconductor to remain on the substrate.

The oxidation in the above-mentioned first to fifth exemplary embodiments may be comprised of application of oxidizing plasma, and the reduction in the above-mentioned first to fifth exemplary embodiments may be comprised of application of reducing plasma. The oxidizing plasma may contain at least oxygen plasma or ozone plasma, for instance. The reducing plasma may contain rare gas plasma such as Ar or He gas plasma, hydrogen gas plasma, and nitrogen gas plasma alone or in combination.

In the first to fifth exemplary embodiments, the first interface layer 14A located at an interface with the first electrical insulator and the second interface layer 14E located at an interface with the second electrical insulator are smaller in a density of oxygen holes than the bulk layer 14B in the oxide-semiconductor film 14 sandwiched between the first electrical insulator (specifically, the gate insulating film 12 or the underlying film 21) and the second electrical insulator (specifically, the protection insulating film 18 or the gate insulating film 12). It should be noted that a density of oxygen holes in only one of the first interface layer 14A and the second interface layer 14E may be designed smaller than a density of oxygen holes in the bulk layer 14B.

In the first to fifth exemplary embodiments, the gate insulating film 12 or the underlying insulating film 21 as the first electrical insulator is formed on the electrically insulating substrate 10. As an alternative, the electrically insulating substrate 10 may be comprised of the first electrical insulator. However, from the viewpoint of a fabrication yield and stability of characteristics, it is preferable to form the first electrical insulator (for instance, the gate insulating film 12 or the underlying film 21) on the electrically insulating substrate 10.

In the above-mentioned first to fifth exemplary embodiments, the thin-film devices 100, 200, 300 and 400 are comprised of a thin-film transistor. As an alternative, the thin-film devices 100, 200, 300 and 400 may be comprised of a thin-film diode.

In the specification, the term "oxide" includes "dioxide".

Example 1

Example 1 is explained hereinbelow with reference to FIGS. 1 to 8.

First, as illustrated in FIG. 1, a Cr metal film as a gate metal film was formed by sputtering on a glass substrate as an electrically insulating substrate 10, and then, the Cr metal film was patterned by a photolithography step into a gate electrode 11.

Then, a silicon nitride film a gate insulating film 12 was formed by sputtering on the electrically insulating substrate 10 so as to cover the gate electrode 11 therewith. The silicon nitride film had a thickness of 300 nanometers.

Then, as illustrated in FIG. 2, first oxidation 131 was applied to the gate insulating film 12 without exposing to atmosphere to thereby oxidize the silicon nitride film at a surface thereof. The first oxidation 131 was comprised of application of oxygen plasma.

Following the first oxidation 131, as illustrated in FIG. 3, an oxide-semiconductor film 14 was formed by sputtering on the gate insulating film 12 without exposing to atmosphere. The oxide-semiconductor film 14 was composed of $InGaZnO_4$, and had a thickness of 100 nanometers.

Sintered $InGaZnO_4$ was used as a target in sputtering. The oxide-semiconductor film 14 may be fabricated by carrying out sputtering separately through the use of oxides of In, Ga and Zn as a target to thereby react them with one another on the electrically insulating substrate 10.

The step of forming the silicon nitride film, the application of oxygen plasma to the gate insulating film 12, and the step of forming the oxide-semiconductor film 14 composed of $InGaZnO_4$ can be successively carried out without exposing to atmosphere by carrying out them in a common sputtering apparatus kept in vacuum (that is, kept in a reduce pressure), for instance.

Then, as illustrated in FIG. 4, the oxide-semiconductor film 14 was patterned by a photolithography step into a desired island.

Then, as illustrated in FIG. 5, reduction 15 was applied to the oxide-semiconductor film 14. The reduction 15 was comprised of application of Ar plasma.

The application of Ar plasma to the oxide-semiconductor film 14 generated oxygen holes at a surface 14C of the oxide-semiconductor film 14 with the result that a resistivity at the surface 14C of the oxide-semiconductor film 14 was reduced to about $1/1000$. Thus, source/drain regions could have an optimal resistivity.

Following the application of Ar plasma to the oxide-semiconductor film 14, a Cr film as a source/drain metal film was formed so as to entirely cover the gate insulating film 12 and the oxide-semiconductor film 14 therewith without exposing to atmosphere, and then, the Cr film was patterned into source/drain electrodes 16, as illustrated in FIG. 6.

Then, as illustrated in FIG. 7, second oxidation 132 was applied to the surface 14C of the oxide-semiconductor film 14 through an opening 16A formed between the source and drain electrodes 16. The second oxidation 132 was comprised of application of oxygen plasma.

The second oxidation 132 was carried out for the purpose of oxidizing the surface 14C (namely, a second interface layer 14E) of the oxide-semiconductor film 14 through the opening 16A to thereby reduce excessive donor electrons caused by oxygen holes. By reducing oxygen holes, it was possible to reduce an off current of the thin-film device 100 by about two columns.

Then, as illustrated in FIG. 8, there was subsequently formed a protection insulating film 18 by sputtering without exposing to atmosphere so as to cover the source and drain electrodes 16 and the oxide-semiconductor film 14 therewith. The protection insulating film 18 was comprised of a silicon nitride film, and had a thickness of 300 nanometers.

Thus, there was fabricated the thin-film transistor 100.

Example 2

Example 2 is explained hereinbelow with reference to FIGS. 9 to 14.

As illustrated in FIG. 9, an underlying insulating film 21 comprised of a silicon nitride film was formed by sputtering on a resin substrate as an electrically insulating substrate 10 by a thickness of 300 nanometers. Then, a Mo metal film was formed on the underlying insulating film 21, and subsequently, the Mo metal film was patterned into source and drain electrodes 16 by a photolithography step.

Then, as illustrated in FIG. 10, first oxidation 131 was applied to the underlying insulating film 21 through an opening 16A formed between the source and drain electrodes 16.

The first oxidation 131 was comprised of application of oxygen plasma.

Following the first oxidation 131, an oxide-semiconductor film 14 composed of $InGaZnO_4$ was formed by sputtering at room temperature on the underlying insulating film 21 and the source/drain electrodes 16 without exposing to atmosphere. The oxide-semiconductor film 14 had a thickness of 60 nanometers. Then, the oxide-semiconductor film 14 was patterned into a desired island, as illustrated in FIG. 11.

Then, as illustrated in FIG. 12, second oxidation 132 was applied to a surface (second interface layer 14E) of the oxide-semiconductor film 14. The second oxidation 132 was comprised of application of oxygen plasma. As a result, the surface of the oxide-semiconductor film 14 was oxidized with the result of reduction in oxygen holes existing at the surface of the oxide-semiconductor film 14.

Then, as illustrated in FIG. 13, there was formed a gate insulating film 12 by sputtering without exposing to atmosphere so as to cover the oxide-semiconductor film 14 and the source and drain electrodes 16 therewith. The gate insulating film 12 was comprised of a silicon nitride film, and had a thickness of 400 nanometers.

Then, as illustrated in FIG. 14, a gate electrode 11 composed of aluminum was formed on the gate insulating film 12.

Then, a protection insulating film 18 was formed by sputtering on the gate insulating film 12 so as to cover the gate electrode 11 therewith. The protection insulating film 18 was comprised of a silicon nitride film, and had a thickness of 300 nanometers.

Thus, there was fabricated the thin-film device 200.

By carrying out the first and second oxidation 131 and 132, it was possible to control a density of electrons in a channel region of the thin-film device 100, ensuring switching characteristics in which an ON/OFF ratio of a drain current had five or more columns.

In order to enhance the switching characteristics, the oxide-semiconductor film 14 is formed by a thickness of 60 nanometers, and immediately thereafter, oxygen plasma is applied to the oxide-semiconductor film 14. Then, the gate insulating film 12 composed of silicon nitride is partially formed as a first gate insulating film. The gate insulating film 12 has a thickness of 50 nanometers.

Then, a multi-layered structure including the oxide-semiconductor film 14, and the gate insulating film 12 formed on the oxide-semiconductor film 14 is patterned into a desired island. Then, the rest of the gate insulating film 12 composed of silicon nitride is formed by a thickness of 350 nanometers as a second gate insulating film.

The thus formed gate insulating film in the thin-film device 200 has a total thickness of 400 nanometers. The thus formed gate insulating film is identical in thickness to the gate insulating film 12 in Example 2, but is different from the gate insulating film 12 in Example 2 in that an interface between the oxide-semiconductor film 14 and the gate insulating film 12 is never exposed to atmosphere. In Example 2, an upper surface of the oxide-semiconductor film 14 is exposed to atmosphere or a photolithography process when the oxide-semiconductor film 14 is patterned.

By preventing an interface between the oxide-semiconductor film 14 and an insulating film (for instance, the gate insulating film 12) from being exposed to atmosphere, it would be possible to suppress generation of oxygen hole defect and other impurity defects, ensuring qualified switching characteristics.

Example 3

Example 3 is explained hereinbelow with reference to FIGS. 15 to 19.

First, as illustrated in FIG. 15, an underlying insulating film 21 was formed by sputtering on a glass substrate as an electrically insulating substrate 10. The underlying insulating film 21 was comprised of a silicon nitride film, and had a thickness of 300 nanometers.

Then, first oxidation 131 was applied to a surface of the underlying insulating film 21 to thereby oxidize a surface of the underlying insulating film 21. The first oxidation 131 was comprised of application of oxygen plasma.

Then, as illustrated in FIG. 16, an oxide-semiconductor film 14 composed of $InGaZnO_4$ was formed by sputtering at room temperature on the underlying insulating film 21 by a thickness of 60 nanometers.

The amorphous oxide-semiconductor film 14 was crystallized by irradiating XeCl excimer laser to the oxide-semiconductor film 14, and fusing and solidifying the same.

Then, as illustrated in FIG. 16, the polycrystal oxide-semiconductor film 14 was patterned into a desired island.

Then, as illustrated in FIG. 16, second oxidation 132 was applied to the polycrystal oxide-semiconductor film 14 to thereby oxidize a surface of the polycrystal oxide-semiconductor film 14 for reducing oxygen hole defect. The second oxidation 132 was comprised of application of oxygen plasma.

The application of oxygen plasma is quite effective when the oxide-semiconductor film 14 composed of $InGaZnO_4$ is crystallized by irradiating laser thereto, since oxygen escapes in a high-temperature molten state.

Following the second oxidation 132, as illustrated in FIG. 17, a gate insulating film 12 comprised of a silicon nitride film was formed by sputtering on the underlying insulating film 21 by a thickness of 100 nanometers without exposing to atmosphere so as to cover the oxide-semiconductor film 14 therewith.

Then, a gate electrode 11 composed of aluminum was formed on the gate insulating film 12.

Then, as illustrated in FIG. 18, an interlayer insulating film 23 comprised of a silicon oxide film was formed on the gate insulating film 12 by a thickness of 400 nanometers so as to cover the gate electrode 11 therewith.

Then, contact holes 19 were formed throughout the interlayer insulating film 23 and the gate insulating film 12 such that the contact holes 19 reach source/drain regions.

Then, as illustrated in FIG. 19, source and drain electrodes 16 were formed in the contact holes 19. Specifically, each of the source and drain electrodes 16 was comprised of a metal plug formed in the contact hole 19 so as to reach the second interface layer 14E of the oxide-semiconductor film 14, and a layer formed on the interlayer insulating film 23 and integrally with the metal plug.

Then, a protection insulating film 18 comprised of a silicon nitride film was formed on the interlayer insulating film 23 so as to cover the source and drain electrodes 16 therewith. The protection insulating film 18 had a thickness of 300 nanometers.

Thus, there was fabricated the thin-film device 300.

Since the oxide-semiconductor film 14 was crystallized in Example 3, electron mobility obtained in Example 3 was about five to ten times greater than electron mobility obtained in Examples 1 and 2.

The thin-film device in accordance with the above-mentioned first to fifth embodiments and Examples 1 to 3 may be applicable to a pixel driver to be used in a flat panel display such as a liquid crystal display or an organic electroluminescence (EL) display. In particular, since oxide-semiconductor is transparent, a pixel driver of a liquid crystal display to which the thin-film device is applied ensures higher backlight transmissivity than a pixel driver to which conventional silicon semiconductor is applied, presenting a brighter high-performance display. Such a driver may be comprised of a thin-film diode including two terminals, as well as a thin-film transistor including three terminals.

An oxide-semiconductor film, even when it was formed at room temperature, has electron mobility greater by about one column than the same of conventionally used amorphous silicon formed at 300 degrees centigrade. Hence, it is possible to fabricate a thin-film transistor array having superior characteristics, even if it was fabricated at room temperature. In particular, it would be possible to control a density of oxygen holes by a low-temperature process in an interface of oxide-semiconductor on which electrical characteristics of a thin-film transistor is dependent. Accordingly, desired characteristics can be obtained in a thin-film device including a resin substrate having low resistance to heat, and hence, the thin-film device in accordance with the above-mentioned embodiments can be applied to a display including a flexible resin substrate.

In the thin-film device in accordance with the above-mentioned exemplary embodiment, it is preferable that oxygen hole densities in both of the first and second interlayer layers are smaller than a density of oxygen holes in the bulk layer.

For instance, the oxide-semiconductor film may be composed of amorphous oxide containing at least one of Zn, Ga and In.

As an alternative, the oxide-semiconductor film may be composed of crystalline oxide containing at least one of Zn, Ga and In.

In the thin-film device in accordance with the above-mentioned exemplary embodiment, it is preferable that the oxide-semiconductor film is formed by crystallizing amorphous oxide with laser irradiation thereto.

In the thin-film device in accordance with the above-mentioned exemplary embodiment, it is preferable that the oxide-semiconductor film is formed by dissolving powdered oxide semiconductor into solvent, coating or printing the solvent onto the first electrical insulator, and heating the solvent to vaporize the solvent.

In the thin-film device in accordance with the above-mentioned exemplary embodiment, it is preferable that the first electrical insulator, the oxide-semiconductor film, and the second electrical insulator are formed on an electrically insulating substrate.

In the thin-film device in accordance with the above-mentioned exemplary embodiment, it is preferable that the electrically insulating substrate is comprised of one of a glass substrate and a resin substrate.

In the thin-film device in accordance with the above-mentioned exemplary embodiment, it is preferable that the thin-film device is comprised of one of a thin-film transistor and a thin-film diode.

In the method of fabricating a thin-film device, in accordance with the above-mentioned exemplary embodiment, it is preferable that the oxidizing is comprised of a step of applying plasma to the oxide-semiconductor film in which one of oxygen plasma and ozone plasma is used.

In the method of fabricating a thin-film device, in accordance with the above-mentioned exemplary embodiment, it is preferable that the first electrical insulator, the oxide-semiconductor film, and the second electrical insulator are formed by forming, in sequence, a gate metal film, a gate insulating film as the first electrical insulator, the oxide-semiconductor film, a source/drain metal film, and a protection insulating film as the second electrical insulator, and wherein the oxidizing and the formation of the oxide-semiconductor film are carried out in this order without exposing the oxide-semiconductor film to atmosphere after the formation of the gate insulating film.

In the method of fabricating a thin-film device, in accordance with the above-mentioned exemplary embodiment, it is preferable that the first electrical insulator, the oxide-semiconductor film, and the second electrical insulator are formed by forming, in sequence, a gate metal film, a gate insulating film as the first electrical insulator, the oxide-semiconductor film, a source/drain metal film, and a protection insulating film as the second electrical insulator, and wherein reduction to the oxide-semiconductor film and the formation of the source/drain metal film are carried out in this order without exposing the oxide-semiconductor film and the source/drain metal film to atmosphere after the oxide-semiconductor film was patterned.

In the method of fabricating a thin-film device, in accordance with the above-mentioned exemplary embodiment, it is preferable that the reduction to the oxide-semiconductor film is comprised of a step of applying plasma to the oxide-semiconductor film in which at least one of rare gas plasma, hydrogen gas plasma, and nitrogen gas plasma alone or in combination is used.

In the method of fabricating a thin-film device, in accordance with the above-mentioned exemplary embodiment, it is preferable that the first electrical insulator, the oxide-semiconductor film, and the second electrical insulator are formed by forming, in sequence, a gate metal film, a gate insulating film as the first electrical insulator, the oxide-semiconductor film, a source/drain metal film, and a protection insulating film as the second electrical insulator, and wherein the oxidizing and the formation of the protection insulating film are carried out in this order without exposing the oxide-semiconductor film and the protection insulating film to atmosphere after the source/drain metal film was patterned.

In the method of fabricating a thin-film device, in accordance with the above-mentioned exemplary embodiment, it is preferable that the first electrical insulator, the oxide-semiconductor film, and the second electrical insulator are formed by forming, in sequence, an underlying electrically insulating film as the first electrical insulator, a source/drain metal film, the oxide-semiconductor film, a gate insulating film as the second electrical insulator, a gate metal film, and a protection insulating film, and wherein the oxidizing and the formation of the gate insulating film are carried out in this order without exposing the oxide-semiconductor film and the gate insulating film to atmosphere after the formation of the oxide-semiconductor film.

In the method of fabricating a thin-film device, in accordance with the above-mentioned exemplary embodiment, it is preferable that the first electrical insulator, the oxide-semiconductor film, and the second electrical insulator are formed by forming, in sequence, an underlying electrically insulating film as the first electrical insulator, a source/drain metal film, the oxide-semiconductor film, a gate insulating film as the second electrical insulator, a gate metal film, and a protection insulating film, and wherein the oxidizing and the formation of the oxide-semiconductor film are carried out in this order without exposing the oxide-semiconductor film to atmosphere after the source/drain metal film was patterned.

In the method of fabricating a thin-film device, in accordance with the above-mentioned exemplary embodiment, it is preferable that the first electrical insulator, the oxide-semiconductor film, and the second electrical insulator are formed by forming, in sequence, an underlying electrically insulating film as the first electrical insulator, the oxide-semiconductor film, a gate insulating film as the second electrical insulator, a gate metal film, an interlayer insulating film, a source/drain metal film, and a protection insulating film, and wherein the oxidizing and the formation of the oxide-semiconductor film are carried out in this order without exposing the oxide-semiconductor film to atmosphere after the formation of the underlying electrically insulating film.

In the method of fabricating a thin-film device, in accordance with the above-mentioned exemplary embodiment, it is preferable that the first electrical insulator, the oxide-semiconductor film, and the second electrical insulator are formed by forming, in sequence, an underlying electrically insulating film as the first electrical insulator, the oxide-semiconductor film, a gate insulating film as the second electrical insulator, a gate metal film, an interlayer insulating film, a source/drain metal film, and a protection insulating film, and wherein the oxidizing and the formation of the gate insulating film are carried out in this order without exposing the oxide-semiconductor film and the gate insulating film to atmosphere after the formation of the oxide-semiconductor film.

In the method of fabricating a thin-film device, in accordance with the above-mentioned exemplary embodiment, it is preferable that the first electrical insulator, the oxide-semiconductor film, and the second electrical insulator are formed by forming, in sequence, a gate metal film, a gate insulating film as the first electrical insulator, a source/drain metal film, the oxide-semiconductor film, and a protection insulating film as the second electrical insulator, and wherein the oxidizing and the formation of the oxide-semiconductor film are carried out in this order without exposing the oxide-semiconductor film to atmosphere after the source/drain metal film was patterned.

In the method of fabricating a thin-film device, in accordance with the above-mentioned exemplary embodiment, it is preferable that the first electrical insulator, the oxide-semiconductor film, and the second electrical insulator are formed by forming, in sequence, a gate metal film, a gate insulating film as the first electrical insulator, a source/drain metal film, the oxide-semiconductor film, and a protection insulating film as the second electrical insulator, and wherein the oxidizing and the formation of the protection insulating film are carried out in this order without exposing the oxide-semiconductor film and the protection insulating film to atmosphere after the oxide-semiconductor film was patterned.

The exemplary advantages obtained by the above-mentioned exemplary embodiments are described hereinbelow.

The thin-film device and the method of fabricating the same both in accordance with the above-mentioned exemplary embodiments make it possible to control the defect (that is, generation of excessive electron donors) caused by oxygen holes existing at an interface between an oxide-semiconductor film and an electrically insulating film. Specifically, it is possible to suppress generation of oxygen holes in a region in which generation of oxygen holes is not required. Thus, it is possible to fabricate a thin-film device having desired characteristics, with high reproducibility and high fabrication yield.

While the present invention has been described in connection with certain exemplary embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

This application is based upon and claims the benefit of priority from Japanese Patent Application No. 2006-217272 filed on Aug. 9, 2006, the entire disclosure of which, including specification, claims, drawings and summary, is incorporated herein by reference in its entirety.

What is claimed is:

1. A method of fabricating a thin-film device, including:
forming an oxide-semiconductor film on a first electrical insulator;
forming a second electrical insulator on said oxide-semiconductor film,
said oxide-semiconductor film defining an active layer,
said oxide-semiconductor film being comprised of a first interface layer located at an interface with said first electrical insulating insulator, a second interface layer located at an interface with said second electrical insulator, and a bulk layer other than said first and second interface layers; and
oxidizing said oxide-semiconductor film to render a density of oxygen holes in at least one of said first and second interlayer layers smaller than a density of oxygen holes in said bulk layer,
wherein said first electrical insulator, said oxide-semiconductor film, and said second electrical insulator are formed by forming, in sequence, a gate metal film, a gate insulating film as said first electrical insulator, said oxide-semiconductor film, a source/drain metal file, and a protection insulating film as said second electrical insulator, and
wherein said oxidizing and the formation of said oxide-semiconductor film are carried out in this order without exposing said oxide-semiconductor film to atmosphere after the formation of said gate insulating film.

2. The method as set forth in claim 1, wherein said oxidizing is comprised of a step of applying plasma to said oxide-semiconductor film in which one of oxygen plasma and ozone plasma is used.

* * * * *